United States Patent
Ding et al.

(10) Patent No.: US 9,349,661 B2
(45) Date of Patent: May 24, 2016

(54) WAFER THINNING ENDPOINT DETECTION FOR TSV TECHNOLOGY

(71) Applicant: GLOBALFOUNDRIES Inc., Grand Cayman (KY)

(72) Inventors: Hanyi Ding, Colchester, VT (US); Oleg Gluschenkov, Tannersville, NY (US); Ping-Chuan Wang, Hopewell Junction, NY (US); Lin Zhou, LaGrangeville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/161,738

(22) Filed: Jan. 23, 2014

(65) Prior Publication Data

US 2015/0206809 A1    Jul. 23, 2015

(51) Int. Cl.
*H01L 21/78* (2006.01)
*H01L 21/66* (2006.01)
*H01L 21/768* (2006.01)

(52) U.S. Cl.
CPC .............. *H01L 22/26* (2013.01); *H01L 22/14* (2013.01); *H01L 21/76898* (2013.01)

(58) Field of Classification Search
CPC ....... H01L 21/301; H01L 21/46; H01L 21/78; B24B 49/00
See application file for complete search history.

(56) References Cited

U.S. PATENT DOCUMENTS

| | | | |
|---|---|---|---|
| 6,106,662 A | 8/2000 | Bibby, Jr. et al. | |
| 6,257,953 B1 * | 7/2001 | Gitis et al. | 451/5 |
| 7,498,236 B2 | 3/2009 | Codding et al. | |
| 2008/0113505 A1 | 5/2008 | Sparks et al. | |
| 2011/0201254 A1 | 8/2011 | Hosali | |
| 2012/0276662 A1 | 11/2012 | Iravani et al. | |
| 2012/0293188 A1 | 11/2012 | Nikolenko et al. | |
| 2013/0011938 A1 | 1/2013 | Tsao et al. | |
| 2013/0109278 A1 | 5/2013 | Kimba | |

* cited by examiner

*Primary Examiner* — Kyoung Lee
(74) *Attorney, Agent, or Firm* — Heslin Rothenberg Farley & Mesiti P.C.

(57) ABSTRACT

Embodiments of the present invention provide an apparatus and method for wafer thinning endpoint detection. Embodiments of the present invention utilize through silicon via (TSV) structures formed in the wafer. A specially made wafer handle is bonded to the wafer. Conductive slurry is used in the wafer backside thinning process. The wafer handle provides electrical connectivity to an electrical measurement tool, and conductive posts in the wafer handle are proximal to a test structure on the wafer. A plurality of electrically isolated TSVs is monitored via the electrical measurement tool. When the TSVs are exposed on the backside as a result of thinning, the conductive slurry shorts the electrically isolated TSVs, changing the electrical properties of the plurality of TSVs. The change in electrical properties is detected and used to trigger termination of the wafer backside thinning process.

10 Claims, 9 Drawing Sheets

WAFER THINNING ENDPOINT DETECTION FOR TSV TECHNOLOGY

FIELD OF THE INVENTION

The present invention relates generally to semiconductor fabrication, and more particularly, to methods and apparatus for wafer thinning.

BACKGROUND OF THE INVENTION

A through-silicon-via, or TSV, provides electrical continuity between the top and bottom surfaces of a semiconductor chip. A TSV is fabricated by deep etching into the silicon wafer, or substrate that comprises the semiconductor chip, and filling the resulting hole with a liner and a metal filling. The silicon substrate is then ground, or thinned, from the backside until the metal filling is exposed, and backside metal (BSM) is disposed on the thinned backside surface for electrical contact. This process is referred to as a backside thinning process. If the silicon is not etched deeply enough, the TSV may be defective. TSVs are useful in schemes such as 3D integration, where multiple chips may be vertically stacked upon one another. 3D integration is one of the ways increased circuit density is being achieved to enable smaller, yet more powerful electronic devices. It is therefore desirable to have improvements in the backside thinning process to improve yield and reliability.

SUMMARY OF THE INVENTION

In a first aspect, embodiments of the present invention provide a wafer handle, comprising: a non-conductive substrate; a first conductive post traversing the non-conductive substrate from a top side of the non-conductive substrate to a bottom side of the non-conductive substrate; a second conductive post traversing the non-conductive substrate from a top side of the non-conductive substrate to a bottom side of the non-conductive substrate, wherein the first conductive post and second conductive post spatially correspond to a test structure on a wafer.

In a second aspect, embodiments of the present invention provide a semiconductor test structure comprising: a conductive coil formed from a metal trace; a plurality of through-silicon vias (TSVs) having a conductive metal disposed therein, the plurality of TSVs configured in an interleaved comb configuration to form a capacitor, wherein the capacitor is electrically connected to the conductive coil. In a third aspect, embodiments of the present invention provide a method of backside thinning endpoint detection, comprising: applying a bonding layer to a semiconductor wafer; attaching a wafer handle to the semiconductor wafer using the bonding layer, wherein the wafer handle comprises: a non-conductive substrate; a first conductive post traversing the non-conductive substrate; a second conductive post traversing the non-conductive substrate; periodically performing a measurement of an electrical parameter using the wafer handle while performing a wafer backside thinning process, wherein the backside thinning process utilizes a conductive slurry; and terminating the wafer backside thinning process in response to detection of a change in the measured electrical parameter.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
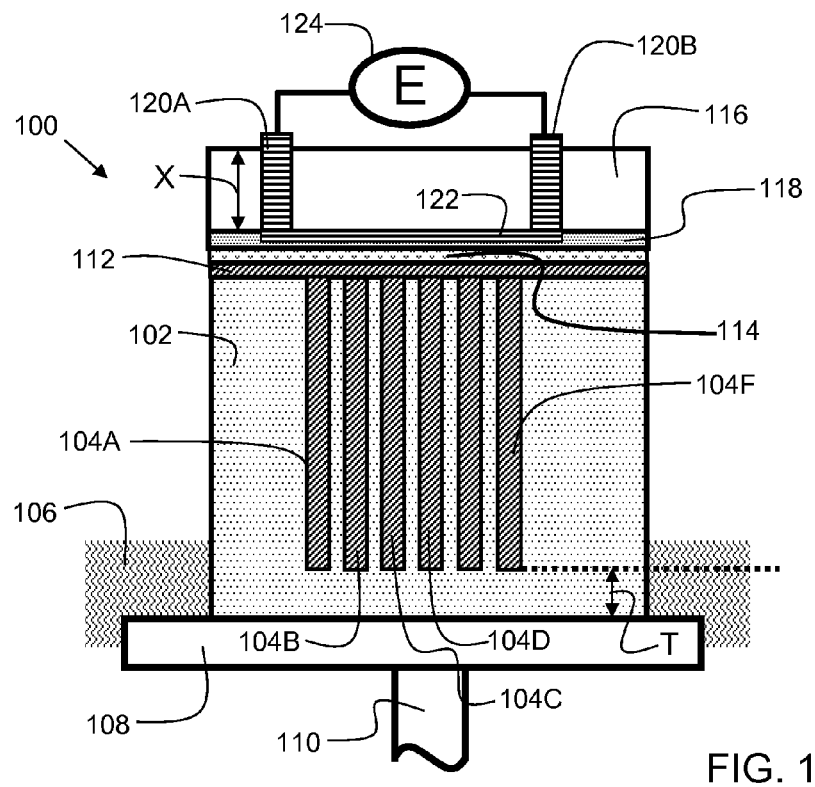

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a wafer handle in accordance with embodiments of the present invention.

Figure 2A:
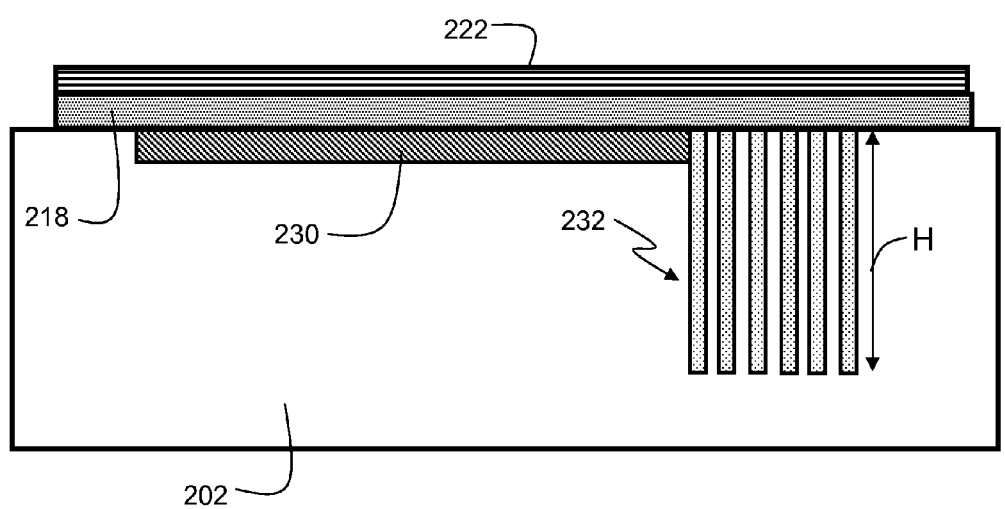

FIG. 2A shows a side view of the wafer handle, indicating the sensing coil built on the wafer handle, and corresponding test structure in accordance with embodiments of the present invention.

Figure 2B:
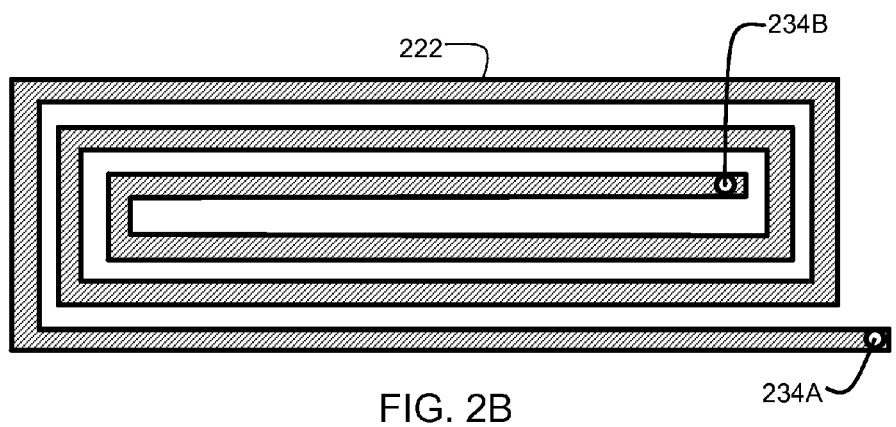

FIG. 2B shows a top down view of the wafer handle sensing coil.

Figure 2C:
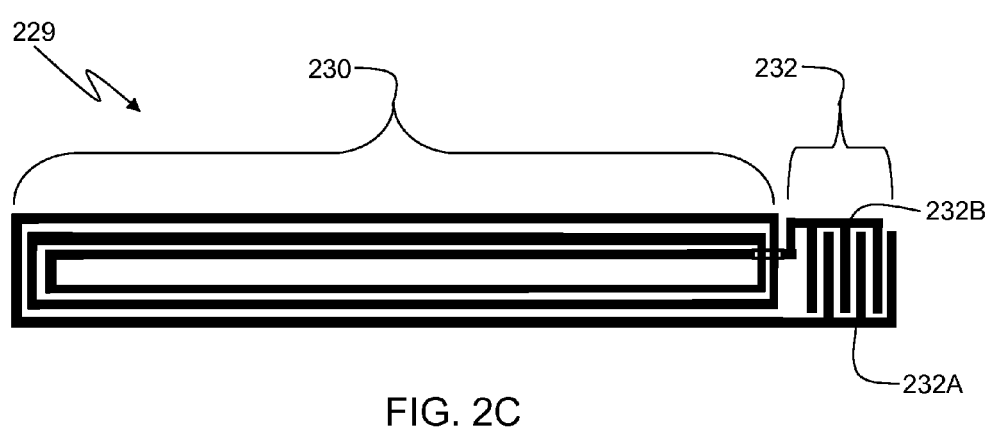

FIG. 2C shows a top down view of a test structure formed in a semiconductor wafer in accordance with embodiments of the present invention.

Figure 2D:
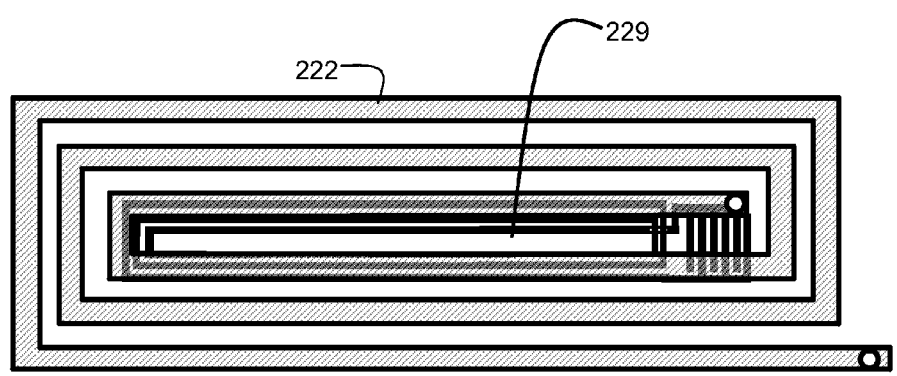

FIG. 2D shows a top down view of the wafer handle sensing coil and the wafer-based test structure in accordance with embodiments of the present invention.

Figure 3:
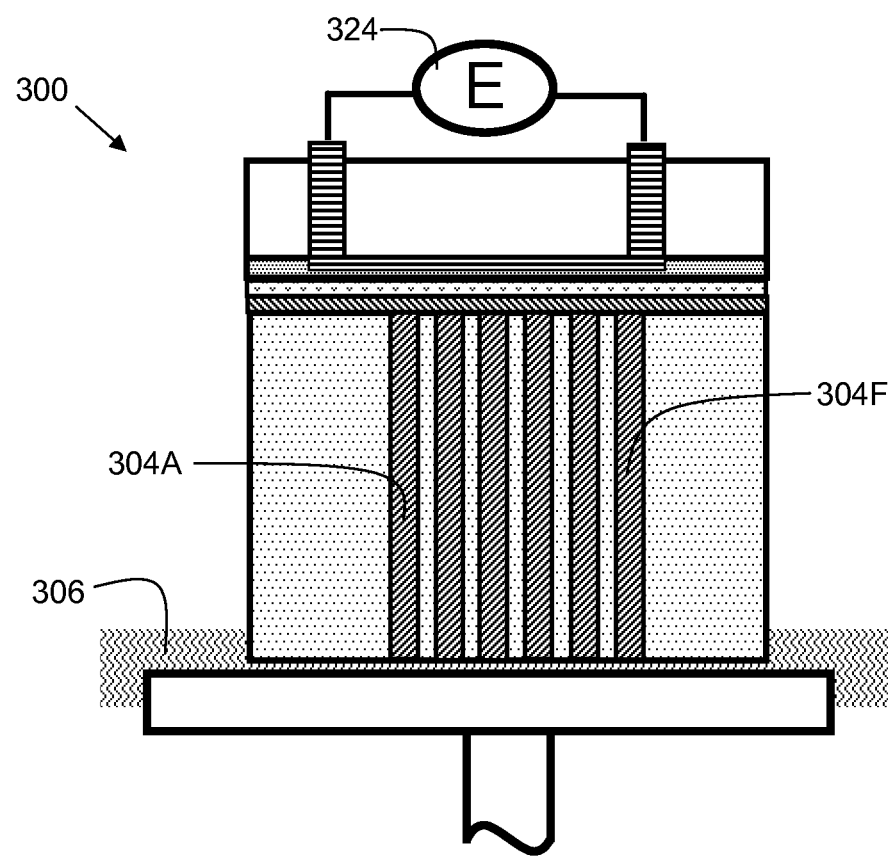

FIG. 3 shows an embodiment of the present invention after performing a wafer backside thinning process.

Figure 4:
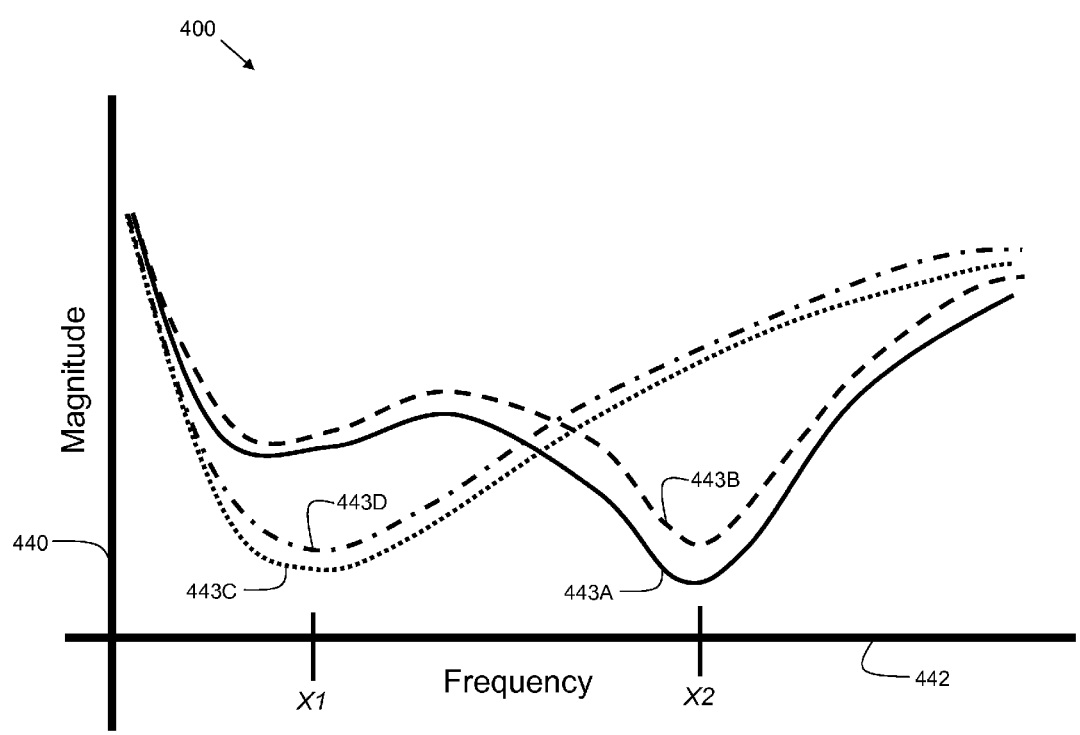

FIG. 4 is a chart showing a resonant frequency shift in accordance with embodiments of the present invention.

Figure 5:
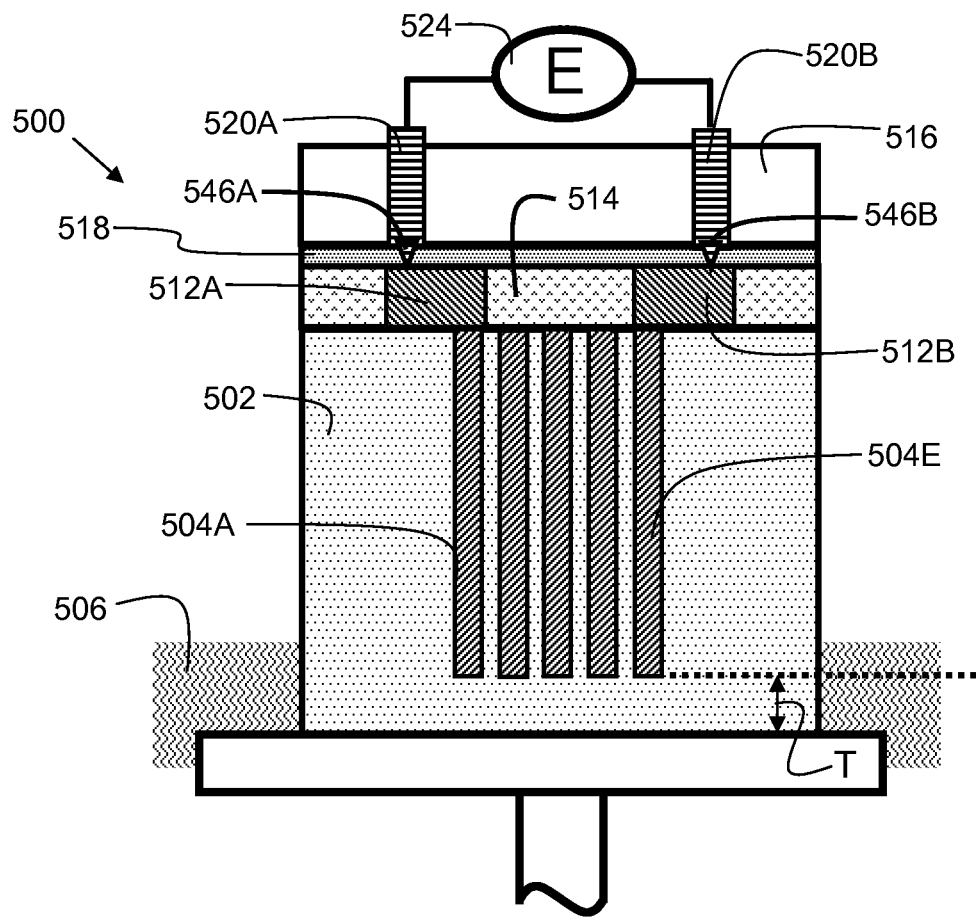

FIG. 5 shows a wafer handle in accordance with alternative embodiments of the present invention.

Figure 6:
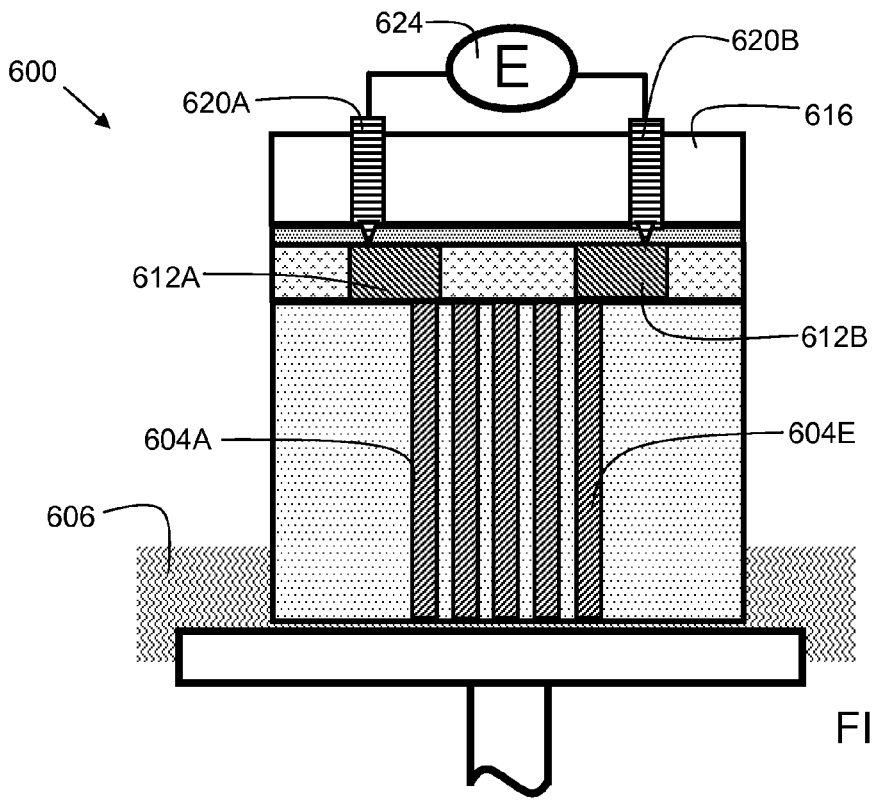

FIG. 6 shows alternative embodiments of the present invention after performing a wafer backside thinning process.

Figure 7:
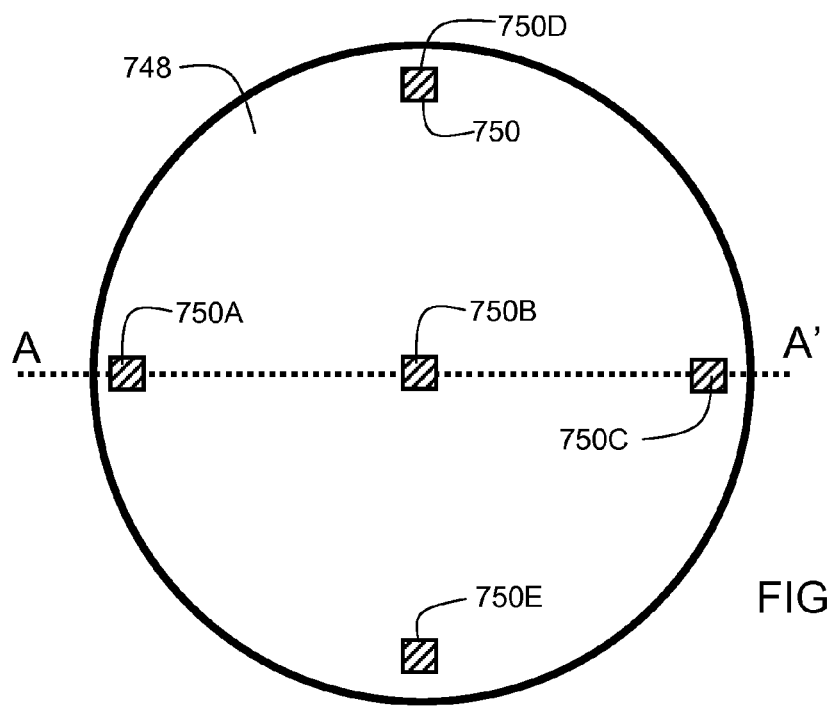

FIG. 7 shows a semiconductor wafer utilizing multiple test structures in accordance with embodiments of the present invention.

Figure 8:
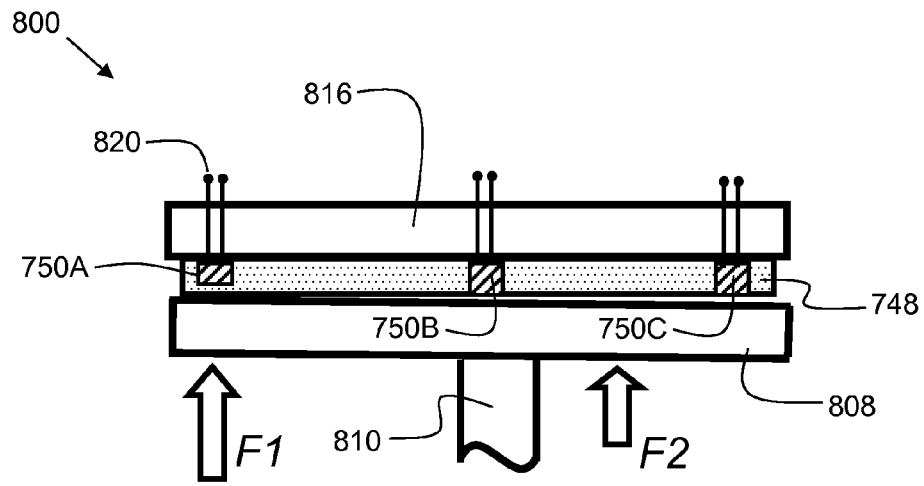

FIG. 8 shows application of a pressure correction in accordance with embodiments of the present invention.

Figure 9:
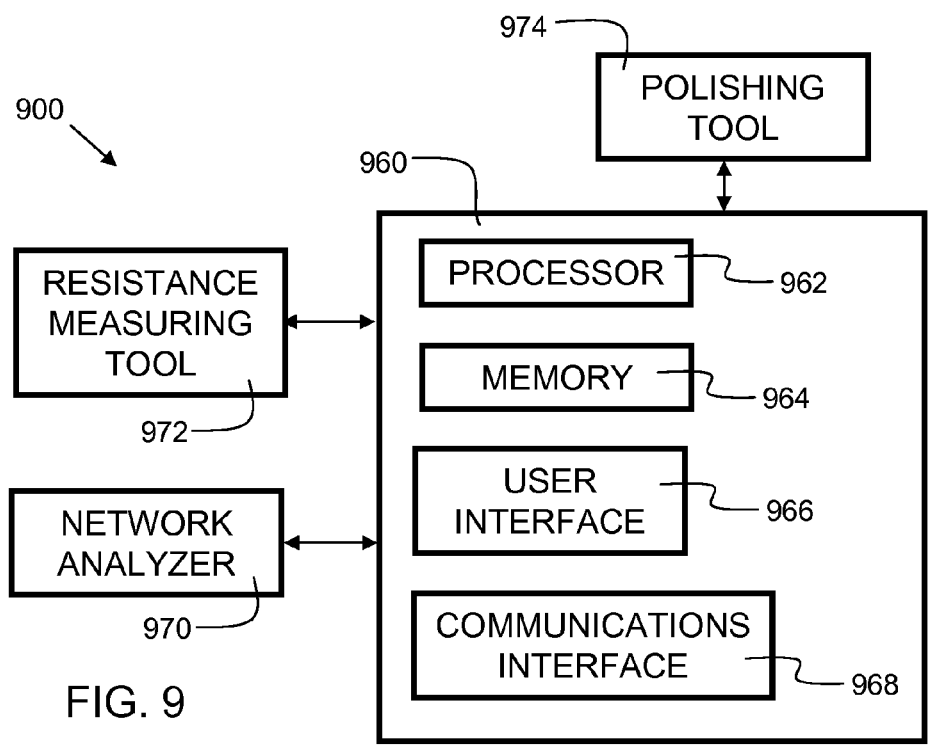

FIG. 9 shows a system in accordance with embodiments of the present invention.

Figure 10:
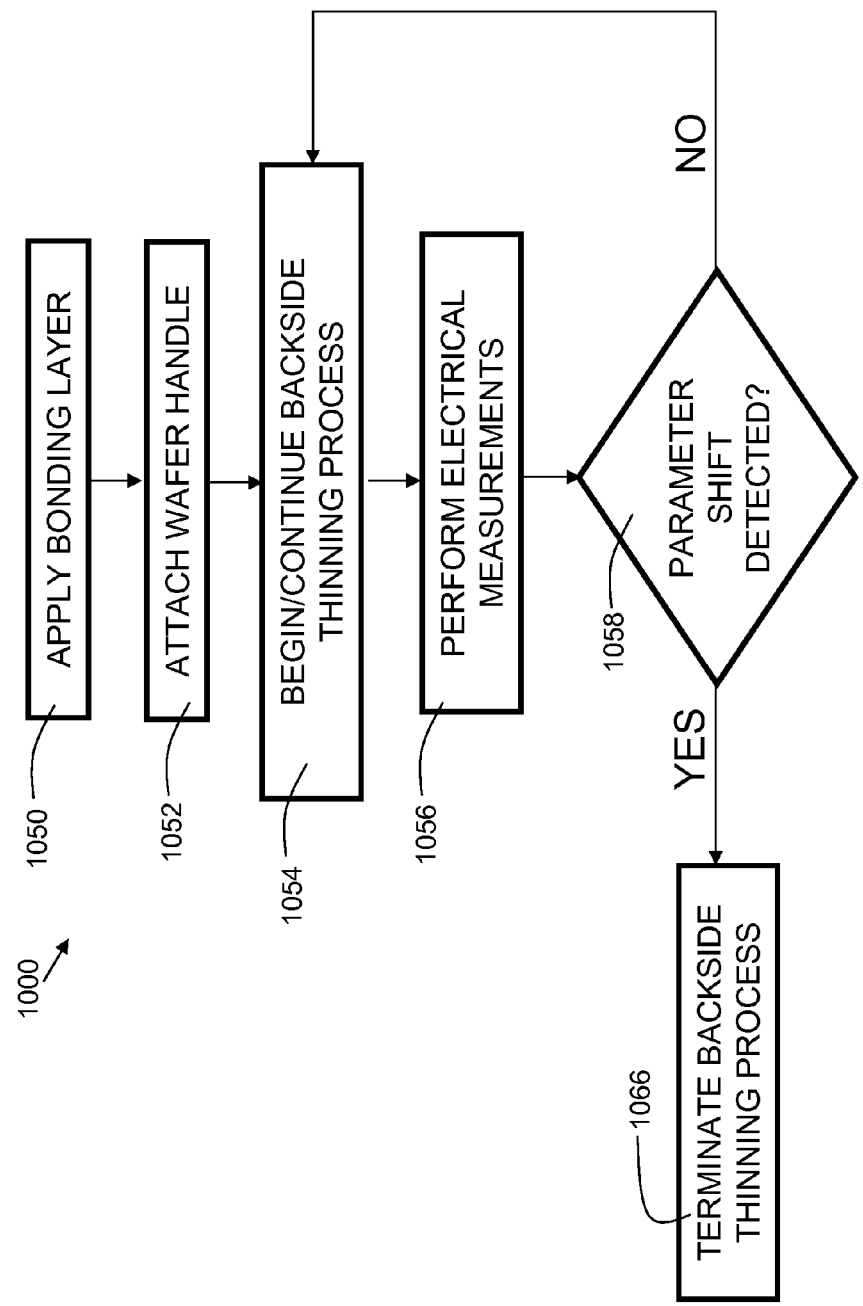

FIG. 10 is a flowchart indicating process steps for embodiments of the present invention.

Figure 11:
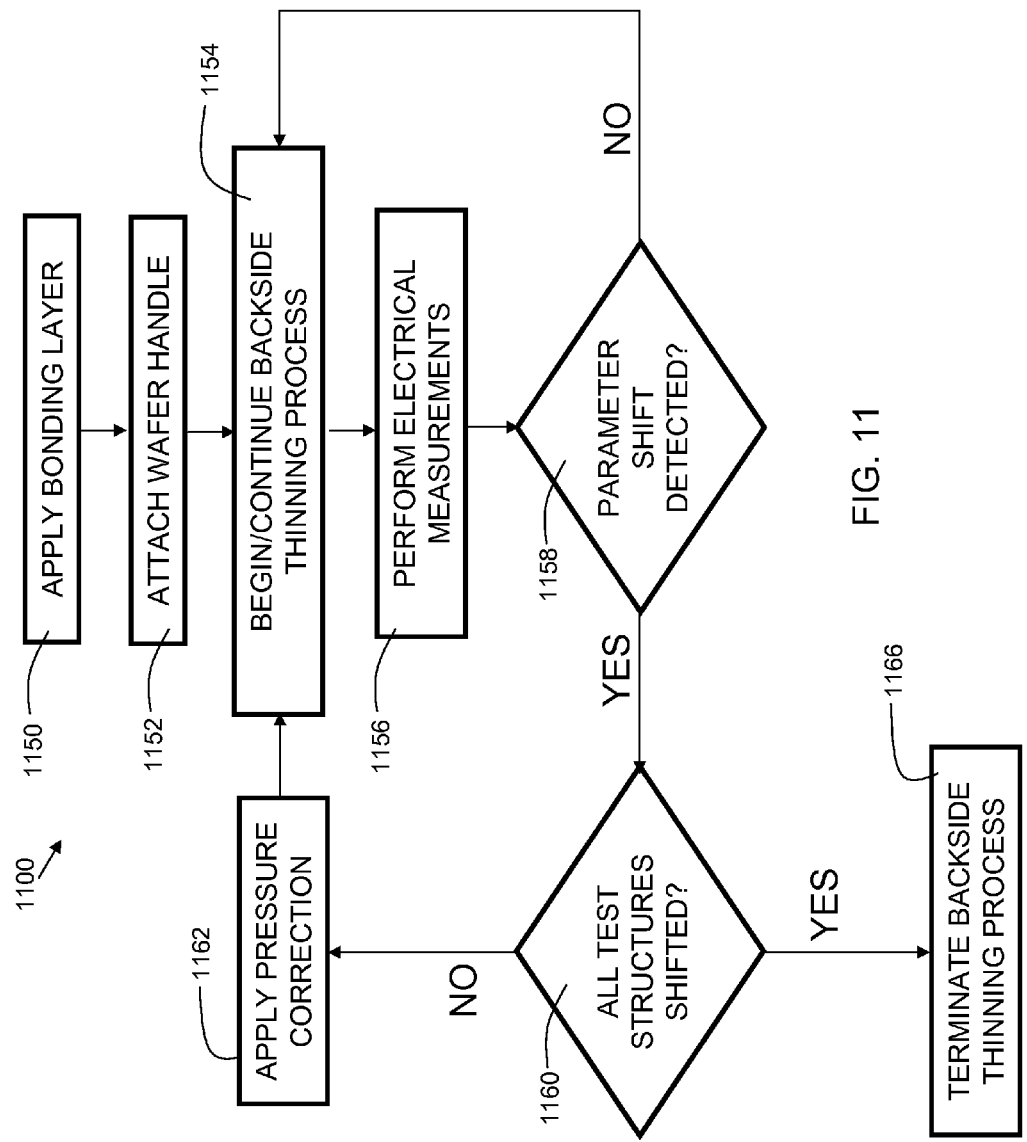

FIG. 11 is a flowchart indicating process steps for alternative embodiments of the present invention.

DETAILED DESCRIPTION

Embodiments of the present invention provide an apparatus and method for wafer thinning endpoint detection. Embodiments of the present invention utilize through silicon via (TSV) structures formed in the wafer. A specially made wafer handle is bonded to the wafer. Conductive slurry is used in the wafer backside thinning process. The wafer handle provides electrical connectivity to an electrical measurement tool, and conductive posts in the wafer handle are proximal to a test structure on the wafer. A plurality of electrically isolated TSVs is monitored via the electrical measurement tool. When the TSVs are exposed on the backside as a result of thinning, the conductive slurry shorts the electrically isolated TSVs, changing the electrical properties of the plurality of TSVs. In some embodiments, a non-contact method is used. The non-contact method utilizes a sensing coil built on the wafer handle to sense the resonant frequency of a test structure on a wafer. In other embodiments, a contact method is used. The contact method uses probe pins built inside the wafer handle that make physical contact with test pads on a wafer for the purposes of making a resistance measurement. Embodiments of the present invention provide the ability to monitor the progress of the backside thinning process by periodically making electrical measurements, and then adjusting and/or terminating the backside thinning process when the electrical properties of the plurality of TSVs change, due to their exposure to the conductive slurry. This allows in-situ monitoring of the backside thinning process, and prevents over and under polishing, thereby providing for improved product yield.

FIG. 1 shows an embodiment 100 comprising a wafer handle 116 in accordance with embodiments of the present invention. In embodiments, wafer handle 116 is comprised of a non-conductive substrate, such as glass. A silicon wafer 102 is disposed on a polishing pad 108, which is rotated by shaft 110, as part of a planarizing tool, such as a chemical mechanical polish (CMP) tool. In embodiments, the polishing pad 108 may rest on a platen (not shown). A plurality of through silicon vias (TSVs), indicated as 104A-104F, are formed in the wafer 102. The TSVs (referred to generally as 104) are filled with a conductive material, including, but not limited to, copper, tungsten, or aluminum. The TSVs 104 enable electrical connections from the top of the silicon wafer to the bottom of the silicon wafer 102. The wafer handle 116 may be the same shape and size as silicon wafer 102. In embodiments, the wafer handle 116 may be circular and have a diameter ranging from about from about 250 millimeters to about 350 millimeters. In embodiments, the wafer handle 116 may have a thickness X ranging from about 20 millimeters to about 50 millimeters. The TSVs 104 may be formed by performing a deep reactive ion etch (DRIE) to form a cavity in the wafer 102 for each TSV. The cavities do not extend all the way to the bottom of the wafer, and so there is a thickness T that is removed from the bottom of the wafer by the planarization tool in order to expose the TSVs 104 at the bottom of the wafer 102. This process is referred to as a backside thinning process. In embodiments of the present invention, the plurality of TSVs 104A-104F form a capacitor. A metal layer 112 in the back end of line (BEOL) of the wafer provides patterned wiring for forming a wafer-based test coil by connecting the TSV 104A to 104F (or more) to form an interleaved comb capacitor. Additional metal layers in the BEOL may be utilized for wiring. A dielectric layer 114 may exist within and above the metal layer 112. Hence, there is a first capacitance C1 as measured among TSV 104A to TSV 104F. The backside thinning process for embodiments of the present invention utilizes conductive slurry 106. The conductive slurry 106 may be a fluid containing metal particles. When the backside thinning process exposes the TSVs on the bottom of the wafer 102, the TSVs 104A-104F are electrically connected together by the conductive slurry 106. This causes a change in capacitance as measured among TSV 104A to TSV 104F changing from first capacitance C1 to a second capacitance C2. Detecting this change in capacitance in real time during the backside thinning process enables the ability to terminate the backside thinning process at the point where the TSVs are exposed on the bottom. Hence, yield issues caused by underpolish and overpolish are mitigated with embodiments of the present invention.

The wafer handle 116 is specially designed with conductive posts 120A and 120B corresponding spatially to (e.g. located directly above) a location on wafer 102 where the plurality of TSVs 104 are located. In embodiments, the conductive posts 120A and 120B are comprised of copper. In other embodiments, tungsten or aluminum may be used for the conductive posts. On the underside of the wafer handle 116, there is a sensing coil 122, which serves as an antenna for a resonant frequency measurement. The tops of the conductive posts are connected to an electrical measurement tool 124, which periodically measures an electrical parameter E. In the embodiment of FIG. 1, the sensing coil 122 built on the the wafer handle 116 provides a non-contact way for monitoring the wafer thinning process, meaning that there is no direct physical conductive contact with the wafer 102. Bonding layer 118 comprises an adhesive that affixes the wafer handle 116 to the wafer 102, but is temporary, such that the wafer handle 116 can be removed once the backside thinning process is complete.

FIG. 2A shows a side view of the sensing coil 222 built inside the wafer handler and corresponding wafer test structure in accordance with embodiments of the present invention. As stated previously, often, similar elements may be referred to by similar numbers in various figures (FIGs) of the drawing, in which case typically the last two significant digits may be the same, the most significant digit being the number of the drawing figure (FIG). Hence, the sensing coil 222 of FIG. 2 is similar to the sensing coil 122 of FIG. 1. The sensing coil 222 is disposed on bonding layer 218. Bonding layer 218 is disposed on wafer 202. Within wafer 202 is coil 230, and TSV array 232. TSV array 232 comprises multiple TSVs configured to act as a capacitor. TSV array 232 is electrically connected to wafer coil 230, thus forming an LC (inductor-capacitor) circuit. Coil 222 is configured to excite the LC circuit. In embodiments, the electrical measurement tool is a network analyzer that is capable of determining a resonant frequency of the LC circuit. When the backside thinning process removes a sufficient amount of wafer material (see T of FIG. 1), the TSV array 232 is then exposed to conductive slurry (106 of FIG. 1). This changes the capacitance of the TSV array, and hence, the resonant frequency of the LC circuit changes. Thus, by detecting a change in the resonant frequency of the LC circuit, the change in capacitance is inferred, and the backside thinning process is terminated. The TSVs within the TSV array 232 have a depth H. In embodiments, the depth H may range from about 10 microns to about 200 microns. In some embodiments, the TSVs of TSV array 232 may be bar shaped. In other embodiments, the TSVs of TSV array 232 may be cylindrical.

FIG. 2B shows a top down view of the sensing coil 222. Contact areas 234A and 234B indicate possible contact points for the conductive posts 120A and 120B respectively.

FIG. 2C shows a top down view of a test structure 229 formed in a semiconductor wafer in accordance with embodiments of the present invention. Wafer coil 230 is electrically connected to TSV array 232, thereby forming an LC circuit. In the embodiment shown, the LC circuit is a parallel LC circuit. Other embodiments, including a series LC circuit, are possible. As can be seen in FIG. 2C, the TSVs of the TSV array 232 comprise a plurality of TSV bars configured in an interleaved comb configuration wherein a first subset of bars 232A is electrically connected together in a first comb configuration, and a second subset of bars 232B is electrically connected together in a second comb configuration, and the first comb configuration and second comb configuration are interleaved.

FIG. 2D shows a top down view of the sensing coil 222 and the wafer-based test structure 229 in accordance with embodiments of the present invention. As can be seen, in this embodiment, the sensing coil 222 is larger than the wafer-based test structure 229. The placement of the wafer handle coil 222 over the test structure is coarse (on the order of microns) and hence, nanometer precision is not required for positioning. Similarly, the position of the contact areas 234A and 234B (FIG. 2B) used as contact points for the conductive posts 120A and 120B respectively also have a tolerance on the order of microns. As such, lithographic methods are not required for the fabrication of the sensing coil built on the wafer handle 116. A mechanical drill may be used to form holes in the wafer handle 116, followed by the insertion of conductive posts 120A and 120B, and attachment of the sensing coil 222.

FIG. 3 shows an embodiment 300 of the present invention after performing a wafer backside thinning process. At this point in the backside thinning process, The TSVs from TSV 304A to 304F are electrically connected to each other by the conductive slurry 306, resulting in a change in the capacitance of TSV array 232 (FIG. 2C). Electrical measurement tool 324 is configured to periodically measure the resonant frequency of the LC circuit shown in FIG. 2C. When the capacitance of TSV array 232 changes, the resonant frequency also changes, since the resonant frequency Fr is a function of the capacitance given by:

$$Fr = \frac{1}{2\pi\sqrt{LC}}$$

Where L is the equivalent inductance as seen from the sensing coil 222 (FIG. 2D) and C is the equivalent capacitance as seen from the sensing coil 222 (FIG. 2D) which is directly related to the TSV array 232 (FIG. 2C) capacitance. Since the TSV array capacitance changes from value C1 to value C2 once the conductive slurry (106 of FIG. 1) makes contact with the TSVs, the resonant frequency Fr also undergoes a change at that time. Hence, an electrical parameter (resonant frequency) undergoes a parameter shift, indicating completion of the backside thinning process.

FIG. 4 is a chart 400 showing an exemplary resonant frequency shift in accordance with embodiments of the present invention. Chart 400 has X axis 442 representing frequency (e.g. in Hertz), and Y axis 440 representing magnitude (e.g. in decibels). A plurality of curves are shown in chart 400. Curve 443A represents a group of TSVs of a first depth prior to being exposed to the conductive slurry (106 of FIG. 1). Curve 443B represents a group of TSVs of a second depth prior to being exposed to the conductive slurry (106 of FIG. 1). The inventors have found that, while the magnitude of the frequency response differs as a function of TSV depth, the resonant frequency X2 varies within a small range (for example, within about 20% of average center of the resonant frequencies) as a function of TSV depth until the conductive slurry exposes the TSVs. Curve 443C represents a group of TSVs of the first depth after being exposed to the conductive slurry. Curve 443D represents a group of TSVs of the second depth after being exposed to the conductive slurry. The magnitude of the curves 443C and 443D varies, but the resonant frequency X1 varies only slightly. Hence, when the electrical measurement tool 324 (FIG. 3) detects a resonant frequency shift from X2 to X1, it can indicate the termination of the backside thinning process. In embodiments, the electrical measurement tool 324 may be configured to automatically communicate with a chemical mechanical polish tool to terminate the backside thinning process.

FIG. 5 shows an embodiment 500 including a wafer handle 516 in accordance with alternative embodiments of the present invention. While wafer handle 116 (of FIG. 1) has a non-contact sensing coil built on the wafer handle, wafer handle 516 has contacts built inside the wafer handle. Wafer handle 516 comprises conductive posts 520A and 520B which traverse the wafer handle 516 from top to bottom. Disposed on the underside of conductive posts 520A and 520B are probe tips 546A and 546B, respectively. In embodiments, the probe tips 546A and 546B may be spring loaded. The wafer handle 516 is affixed to the wafer using bonding layer 518. The probe tips 546A and 546B traverse the bonding layer to make direct physical contact with probe pads 512A and 512B respectively. The probe pads may be part of back-end-of-line (BEOL) structures, and may be implemented with a metallization and/or via layer, or combinations thereof. Probe pad 512A is electrically connected to TSV 504A, and probe pad 512B is electrically connected to TSV 504E. The probe pads 512A and 512B are electrically isolated from each other by dielectric layer 514. The TSVs (including 504A and 504E) do not extend all the way to the bottom of the wafer, and so there is a thickness T that is removed from the bottom of the wafer by the planarization tool in order to expose the TSVs at the bottom of the wafer 502. This process is referred to as a backside thinning process. The tops of the conductive posts 520A and 520B are connected to an electrical measurement tool 524, which periodically measures an electrical parameter E. In the embodiment of FIG. 5, the wafer handle 516 with the contact probe built inside the wafer handle provides an electrical connection with direct physical contact to a test structure on the wafer 502. The electrical measurement tool 524 may be configured to periodically make a resistance measurement. As shown in FIG. 5, prior to the conductive slurry 506 contacting the TSVs 504A and 504B, the electrical parameter E measured by the electrical measurement tool 524 indicates an open circuit (infinite resistance).

FIG. 6 shows an embodiment 600 which is similar to that shown in FIG. 5, after performing a wafer backside thinning process. At this stage, the conductive slurry 606 is in contact with TSV 604A to TSV 604E, and the electrical parameter E measured by the electrical measurement tool 524 indicates a short circuit (very low resistance). Hence, an electrical parameter (resistance) undergoes a parameter shift (from a very high or infinite resistance to a very low resistance), indicating completion of the backside thinning process.

FIG. 7 shows a semiconductor wafer 748 utilizing multiple test structures (indicated generally as 750) in accordance with embodiments of the present invention. In embodiments, the test structures 750 may be of the LC circuit variety as shown in the embodiment of FIGS. 2A-2D, for use with a non-contact sensing coil built on the wafer handle such as 116 of FIG. 1. In other embodiments, the test structures 750 may be of the contact variety as shown in the embodiment of FIG. 5 and FIG. 6, for use with contact probes built inside the wafer handle such as 516 of FIG. 5. As indicated in FIG. 7, multiple test structures are positioned at various locations on the wafer 748. Through line A-A', there is test structure 750A at the left edge, test structure 750B in the center, and test structure 750C at the right edge. Similarly, there is test structure 750D at the top edge, and test structure 750E at the bottom edge. While five test structures 750A-750E are shown, in practice, there may be more or fewer test structures in some embodiments. In embodiments, these test structures may be built in the wafer kerf area (i.e. the area between any functional chips, such as the dicing channel).

Positioning multiple test structures throughout the wafer provides the ability to ascertain wafer uniformity. For example, if during the backside thinning process, it is found that test structures 750B, 750C, 750D, and 750E have had their TSVs exposed by the conductive slurry, indicating a completed backside thinning process, while test structure 750A has not completed the backside thinning process, then planarizing tool adjustments may be made in response to this information. In particular, a pressure correction may be applied at the planarizing tool to compensate for the detected wafer non-uniformity.

FIG. 8 shows an embodiment 800 with an application of a pressure correction in accordance with embodiments of the present invention. FIG. 8 shows wafer 748 in a side view as viewed along line A-A' of FIG. 7. As such, test structures 750A, 750B, and 750C are visible. Each test structure has a corresponding set of conductive posts 820 disposed above it and disposed within wafer handle 816. The polishing pad 808 may be tilted at an angle to apply a first force F1 in the area of test structure 750A, while a second force F2 is applied in the area of test structure 750C, where F1 is greater than F2, thereby providing in-situ compensation for wafer non-uniformity during the backside thinning process. The change in pressure may be achieved by applying a tilt to polishing pad 808 as it is revolved by shaft 810.

FIG. 9 shows a system 900 in accordance with embodiments of the present invention. System 900 comprises a computer 960 which comprises processor 962 which is configured and disposed to access instructions stored in memory 964. The memory 964 may be a non-transitory memory, and may include flash, static ram, or other suitable storage types. A user interface 966 may include a display, keyboard, mouse, touch screen, or other suitable interface. A communications interface 968 may include serial, parallel, USB, Ethernet, as well as wireless communication protocols to allow communication with electrical measuring tools including resistance measuring tool 972 and/or network analyzer 970. Communication is also facilitated between computer 960 and polishing tool 974. Polishing tool 974 may be a chemical mechanical polishing (CMP) tool that utilizes conductive slurry. In embodiments, the communication between computer 960 and polishing tool 974 may utilize the SECS/GEM interface protocol. In some embodiments, the resistance measuring tool 972 and network analyzer 970 may be encompassed in a single device. Furthermore, some embodiments may not utilize one of the tools. For example, if contact wafer handles are used exclusively, the network analyzer 970 is not needed. Similarly, if non-contact wafer handles are used exclusively, the resistance measuring tool 972 is not needed. In embodiments, the computer 960 receives periodic measurement data from the network analyzer 970 and/or resistance measuring tool 972. If the tools 970 and 972 provide information indicating a subset of test structures (e.g. 750 of FIG. 7) being exposed to conductive slurry during a backside thinning process, this indicates potential wafer non-uniformity, as ideally, all the test structures should be exposed to conductive slurry at about the same time. In the case of detected wafer non-uniformity, the computer 960 communicates instructions to polishing tool 974 to apply a pressure correction to compensate for the wafer non-uniformity. In other embodiments, an alert may be issued to an operator indicating the detection of wafer non-uniformity.

FIG. 10 is a flowchart 1000 indicating process steps for embodiments of the present invention. In process step 1050, a bonding layer is applied to a wafer. In process step 1052, a wafer handle is attached to the wafer, and aligned such that conductive posts in the wafer handle are positionally aligned with corresponding test structures on the wafer. In process step 1054, a backside thinning process is begun. This may comprise a chemical mechanical polish (CMP) process which utilizes conductive slurry and/or a conductive polishing pad. During the backside thinning process, electrical measurements are performed in process step 1056. The electrical measurements may include, but are not limited to, resonant frequency measurements, capacitance measurements, inductance measurements, resistance measurements, and impedance measurements. In process step 1058, a check is made to determine if a parameter shift occurred. In the case of a contact wafer handle, the parameter shift may include detecting a change from a high resistance to a lower resistance. In the case of a non-contact wafer handle, the parameter shift may include detecting a change in resonant frequency. If the parameter shift has not occurred, the flow returns to process step 1054, and the backside thinning process is continued. If the parameter shift has occurred, then the backside thinning process is terminated in process step 1066. Once the process is completed, the wafer handle may be removed, and industry standard techniques may be used to complete fabrication of the integrated circuit (IC).

FIG. 11 is a flowchart 1100 indicating process steps for alternative embodiments of the present invention. In process step 1150, a bonding layer is applied to a wafer. In process step 1152, a wafer handle is attached to the wafer, and aligned such that conductive posts in the wafer handle are positionally aligned with corresponding test structures on the wafer. In process step 1154, a backside thinning process is begun. This may comprise a chemical mechanical polish (CMP) process which utilizes conductive slurry and/or a conductive polishing pad. During the backside thinning process, electrical measurements are performed in process step 1156. The electrical measurements may include, but are not limited to, resonant frequency measurements, capacitance measurements, inductance measurements, resistance measurements, and impedance measurements. In process step 1158, a check is made to determine if a parameter shift occurred. In the case of a contact wafer handle, the parameter shift may include detecting a change from a high resistance to a lower resistance. In the case of a non-contact wafer handle, the parameter shift may include detecting a change in resonant frequency. If the parameter shift has not occurred, the flow returns to process step 1154, and the backside thinning process is continued. If the parameter shift has occurred, then the flow continues to process step 1160, where a check is made to determine if all of the multiple test structures on a wafer (e.g. 750A-750E of FIG. 7) have exhibited a parameter shift. If a subset of the test structures have not exhibited a parameter shift, while other test structures have exhibited a parameter shift, then a pressure correction is applied in process step 1162 (as illustrated in FIG. 8). The flow then continues to process step 1154 where the backside thinning process continues with the modified pressure parameters. If, at process step 1160, all test structures have exhibited a parameter shift, then the backside thinning process is terminated in process step 1166. Once the process is completed, the wafer handle may be removed, and industry standard techniques may be used to complete fabrication of the integrated circuit (IC).

As can now be appreciated, embodiments of the present invention provide in-situ endpoint detection in real time during the wafer backside thinning process, preventing underpolish and overpolish, and thus saving cost, and improving overall product yield.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of backside thinning endpoint detection, comprising:

applying a bonding layer to a semiconductor wafer;

attaching a wafer handle to the semiconductor wafer using the bonding layer, wherein the wafer handle comprises:

a non-conductive substrate;

a first conductive post traversing the non-conductive substrate;

a second conductive post traversing the non-conductive substrate;

periodically performing a measurement of an electrical parameter using the wafer handle while performing a wafer backside thinning process, wherein the backside thinning process utilizes a conductive slurry;

terminating the wafer backside thinning process in response to detection of a change in the measured electrical parameter; and wherein the semiconductor wafer comprises a plurality of test structures, and wherein the wafer handle comprises a plurality of conductive posts spatially corresponding to the plurality of test structures, the method further comprising:

determining which of the plurality of test structures is the last to undergo a parameter shift; and applying a pressure correction for the wafer backside thinning process in response to the determination of the last test structure of the plurality of test structures to undergo a parameter shift.

2. The method of claim 1, wherein periodically performing a measurement of an electrical parameter comprises periodically performing a resonant frequency measurement.

3. The method of claim 1, wherein periodically performing a measurement of an electrical parameter comprises periodically performing a capacitance measurement.

4. The method of claim 1, wherein periodically performing a measurement of an electrical parameter comprises periodically performing a resistance measurement.

5. The method of claim 1, wherein periodically performing a measurement of an electrical parameter comprises periodically performing a resonant frequency measurement.

6. The method of claim 1, wherein periodically performing a measurement of an electrical parameter comprises periodically performing a resistance measurement.

7. The method of claim 1, wherein performing a wafer backside thinning process comprises performing a chemical mechanical polish process.

8. The method of claim 1, wherein performing a wafer backside thinning process comprises performing a chemical mechanical polish process, and wherein applying a pressure correction comprises tilting a polishing pad.

9. The method of claim 5, wherein periodically performing a resonant frequency measurement is performed with a network analyzer that is electrically connected to the first conductive post and second conductive post of the wafer handle.

10. The method of claim 6, wherein periodically performing a resistance measurement is performed with resistance measuring tool that is electrically connected to the first conductive post and second conductive post of the wafer handle.

* * * * *